United States Patent
Kato et al.

(10) Patent No.: US 11,264,266 B2
(45) Date of Patent: Mar. 1, 2022

(54) SUBSTRATE PROCESSING METHOD

(71) Applicant: Tokyo Electron Limited, Tokyo (JP)

(72) Inventors: Hitoshi Kato, Iwate (JP); Yuji Nishino, Iwate (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/735,889

(22) Filed: Jan. 7, 2020

(65) Prior Publication Data

US 2020/0234997 A1 Jul. 23, 2020

(30) Foreign Application Priority Data

Jan. 18, 2019 (JP) .............................. JP2019-007276

(51) Int. Cl.
*H01L 21/687* (2006.01)
*H01L 21/02* (2006.01)

(52) U.S. Cl.
CPC .. *H01L 21/68764* (2013.01); *H01L 21/02164* (2013.01); *H01L 21/02274* (2013.01); *H01L 21/68785* (2013.01)

(58) Field of Classification Search
CPC ........ C23C 16/45551; H01L 21/68764–68792
See application file for complete search history.

(56) References Cited

U.S. PATENT DOCUMENTS

2016/0122872 A1* 5/2016 Kato ....................... C23C 16/52
427/8
2017/0002464 A1* 1/2017 Miura ............... C23C 16/45551
2020/0090978 A1* 3/2020 AuBuchon ........ C23C 16/45544

FOREIGN PATENT DOCUMENTS

JP 2017-139449 8/2017

* cited by examiner

*Primary Examiner* — Alia Sabur
(74) *Attorney, Agent, or Firm* — IPUSA, PLLC

(57) ABSTRACT

A substrate processing method is implemented in a substrate processing apparatus including a processing chamber, a turntable on which a substrate is placed inside the processing chamber, and first and second gas supplies that supply first and second gases, respectively. The substrate processing method deposits a film, generated by a reaction between the first gas and the second gas, on the substrate in a first state where the substrate rotates and the turntable undergoes a clockwise orbital rotation around a rotating shaft so that the substrate passes through a region supplied with the first gas and thereafter passes through a region supplied with the second gas, and deposits the film on the substrate in a second state where the substrate rotates and the turntable undergoes a counterclockwise orbital rotation.

20 Claims, 13 Drawing Sheets

| | ROTATION & CLOCKWISE ORBITAL ROTATION | ROTATION & COUNTERCLOCKWISE ORBITAL ROTATION | ROTATION & CLOCKWISE AND COUNTERCLOCKWISE ORBITAL ROTATIONS |
|---|---|---|---|
| AVERAGE FILM THICKNESS (AVG) | 8.50 nm | 10.97 nm | 19.47 nm |
| MAXIMUM VALUE (Max) OF FILM THICKNESS | 8.65 nm | 11.08 nm | 19.55 nm |
| MINIMUM VALUE (Min) OF FILM THICKNESS | 8.47 nm | 10.84 nm | 19.30 nm |
| DIFFERENCE (Max-Min) | 0.18 nm | 0.24 nm | 0.25 nm |
| FILM DEPOSITION TIME | 14.0 min | 21.0 min | 35.0 min |
| VALUE OF FILM THICKNESS DISTRIBUTION | 1.052% | 1.093% | 0.635% |

|  | ROTATION & CLOCKWISE ORBITAL ROTATION | ROTATION & COUNTERCLOCKWISE ORBITAL ROTATION |
|---|---|---|
| AVERAGE FILM THICKNESS (AVG) | 21.01 nm | 17.93 nm |
| MAXIMUM VALUE (Max) OF FILM THICKNESS | 21.37 nm | 18.10 nm |
| MINIMUM VALUE (Min) OF FILM THICKNESS | 20.93 nm | 17.71 nm |
| DIFFERENCE (Max-Min) | 0.44 nm | 0.39 nm |
| VALUE OF FILM THICKNESS DISTRIBUTION | 1.052% | 1.093% |

FIG.11
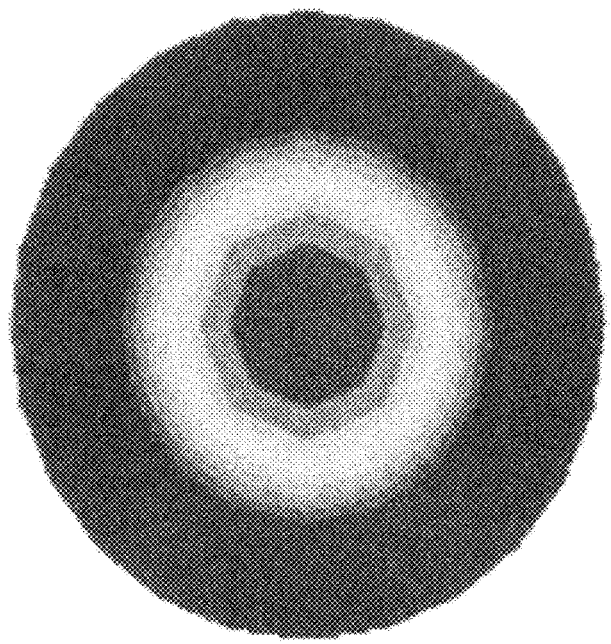
20.929        21.371
FIG.12
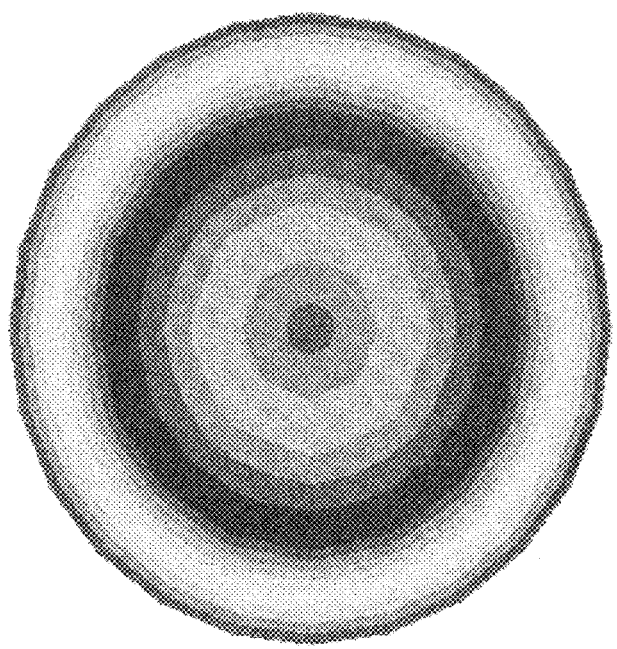
17.712        18.104

FIG.13

| | ROTATION & CLOCKWISE ORBITAL ROTATION | ROTATION & COUNTERCLOCKWISE ORBITAL ROTATION | ROTATION & CLOCKWISE AND COUNTERCLOCKWISE ORBITAL ROTATIONS |
|---|---|---|---|
| AVERAGE FILM THICKNESS (AVG) | 10.50 nm | 8.96 nm | 19.47 nm |
| MAXIMUM VALUE (Max) OF FILM THICKNESS | 10.69 nm | 9.05 nm | 19.59 nm |
| MINIMUM VALUE (Min) OF FILM THICKNESS | 10.46 nm | 8.86 nm | 19.32 nm |
| DIFFERENCE (Max−Min) | 0.22 nm | 0.20 nm | 0.27 nm |
| FILM DEPOSITION TIME | 17.2 min | 17.2 min | 34.4 min |
| VALUE OF FILM THICKNESS DISTRIBUTION | 1.052% | 1.093% | 0.685% |

FIG.14
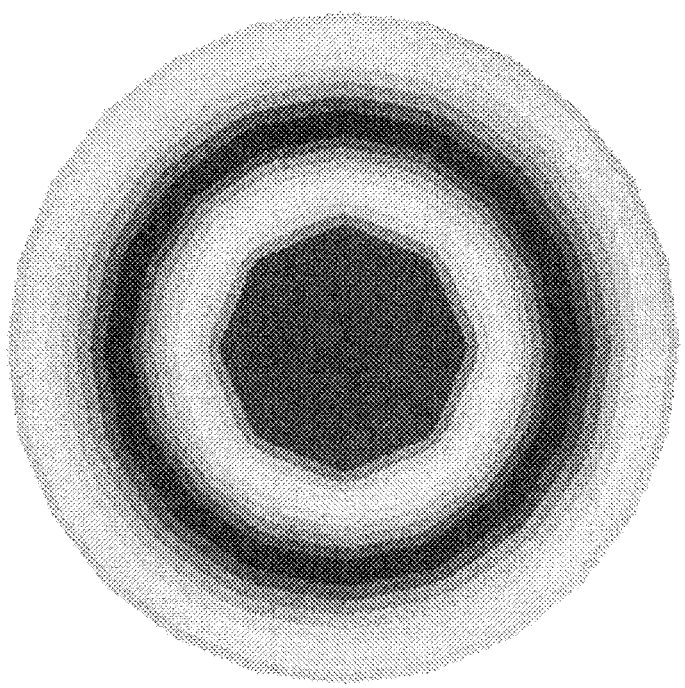
19.32                    19.587

FIG.16

| | ROTATION & CLOCKWISE ORBITAL ROTATION | ROTATION & COUNTERCLOCKWISE ORBITAL ROTATION | ROTATION & CLOCKWISE AND COUNTERCLOCKWISE ORBITAL ROTATIONS |
|---|---|---|---|
| AVERAGE FILM THICKNESS (AVG) | 8.50 nm | 10.97 nm | 19.47 nm |
| MAXIMUM VALUE (Max) OF FILM THICKNESS | 8.65 nm | 11.08 nm | 19.55 nm |
| MINIMUM VALUE (Min) OF FILM THICKNESS | 8.47 nm | 10.84 nm | 19.30 nm |
| DIFFERENCE (Max-Min) | 0.18 nm | 0.24 nm | 0.25 nm |
| FILM DEPOSITION TIME | 14.0 min | 21.0 min | 35.0 min |
| VALUE OF FILM THICKNESS DISTRIBUTION | 1.052% | 1.093% | 0.635% |

SUBSTRATE PROCESSING METHOD

CROSS-REFERENCE TO RELATED APPLICATIONS

This application is based upon and claims priority to Japanese Patent Application No. 2019-007276, filed on Jan. 18, 2019, the entire contents of which are incorporated herein by reference.

BACKGROUND

1. Field of the Invention

The present disclosure relates to a substrate processing method for processing (or treating) a substrate.

2. Description of the Related Art

An example of a substrate processing apparatus that processes a substrate is described in Japanese Laid-Open Patent Publication No. 2017-139449, for example. This substrate processing apparatus performs a process using a processing gas, while causing the substrate, placed on a turntable within a processing chamber, to undergo an orbital rotation. A stage on which the substrate is placed, is rotatable around an axis of rotation extending along a rotating shaft of the turntable. Hence, the turntable is rotated while the stage rotates.

According to the substrate processing apparatus described above, a thickness distribution of a film that is deposited on the substrate can be made uniform, by causing the substrate to undergo the orbital rotation. However, due to further refinements (or size reductions) or the like of semiconductor devices, there are demands to further improve the uniformity of the thickness distribution of the film that is deposited.

SUMMARY

According to one aspect of the embodiments, a substrate processing method implemented in a substrate processing apparatus that includes a processing chamber, a turntable on which a substrate is placed inside the processing chamber, and a first gas supply and a second gas supply configured to supply a first gas and a second gas, respectively, includes depositing a film, generated by a reaction between the first gas and the second gas, on the substrate in a first state where the substrate rotates and the turntable undergoes a clockwise orbital rotation around a rotating shaft so that the substrate passes through a region supplied with the first gas and thereafter passes through a region supplied with the second gas; and depositing the film on the substrate in a second state where the substrate rotates and the turntable undergoes a counterclockwise orbital rotation.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 11 is a diagram for explaining a thickness distribution of the film that is deposited when the turntable is caused to undergo a clockwise orbital rotation while the waver is rotated.

FIG. 12 is a diagram for explaining a thickness distribution of the film that is deposited when the turntable is caused to undergo a counterclockwise orbital rotation while the waver is rotated.

FIG. 13 is a diagram for explaining the thickness of the film that is deposited by the substrate processing method according to the embodiment.

FIG. 14 is a diagram for explaining the thickness distribution of the film that is deposited by the substrate processing method according to the embodiment.

FIG. 16 is a diagram for explaining a thickness of another film that is deposited by the substrate processing method according to the embodiment.

DETAILED DESCRIPTION

A description will hereinafter be given of embodiments of the present invention with reference to the drawings.

[Substrate Processing Apparatus]

A film deposition apparatus 1 that performs a film deposition process on a wafer W, which is an example of a substrate, using Atomic Layer Deposition (ALD), will be described as an example of a disclosed substrate processing apparatus according to one embodiment. The substrate processing apparatus according to this embodiment may be applied to various substrate processing apparatuses, as long as the substrate processing apparatus includes a rotatable susceptor, that is, a turntable type susceptor, and a substrate holder provided on an upper surface of the susceptor. In this embodiment, however, the substrate processing apparatus is formed as the film deposition apparatus that performs the ALD, for example.

In addition, the kind of film deposited by the film deposition apparatus that performs the ALD is not particularly limited, and the film may be any depositable kind of film. This embodiment will be described for an example in which, after causing Bis-Tertiary Butyl Amino Silane (BTBAS) gas to be adsorbed on the wafer, as an example of a source gas including silicon (Si), ozone ($O_3$) gas is supplied as an oxidation gas that oxidizes the BTBAS gas, to form a molecular film of silicon oxide ($SiO_2$). In addition, in this example, the molecular film is exposed to plasma generated from a plasma generation gas, to reform the molecular film, for example. In this example, the film deposition apparatus is configured to repeat a series of these processes a plurality of times, so as to form a $SiO_2$ film as an example of a reaction product that is generated by the reaction between the BTBAS gas and the oxidation gas. The source gas, the oxidation gas, and the plasma generation gas described above correspond to processing gases used in this embodiment.

Figure 1:
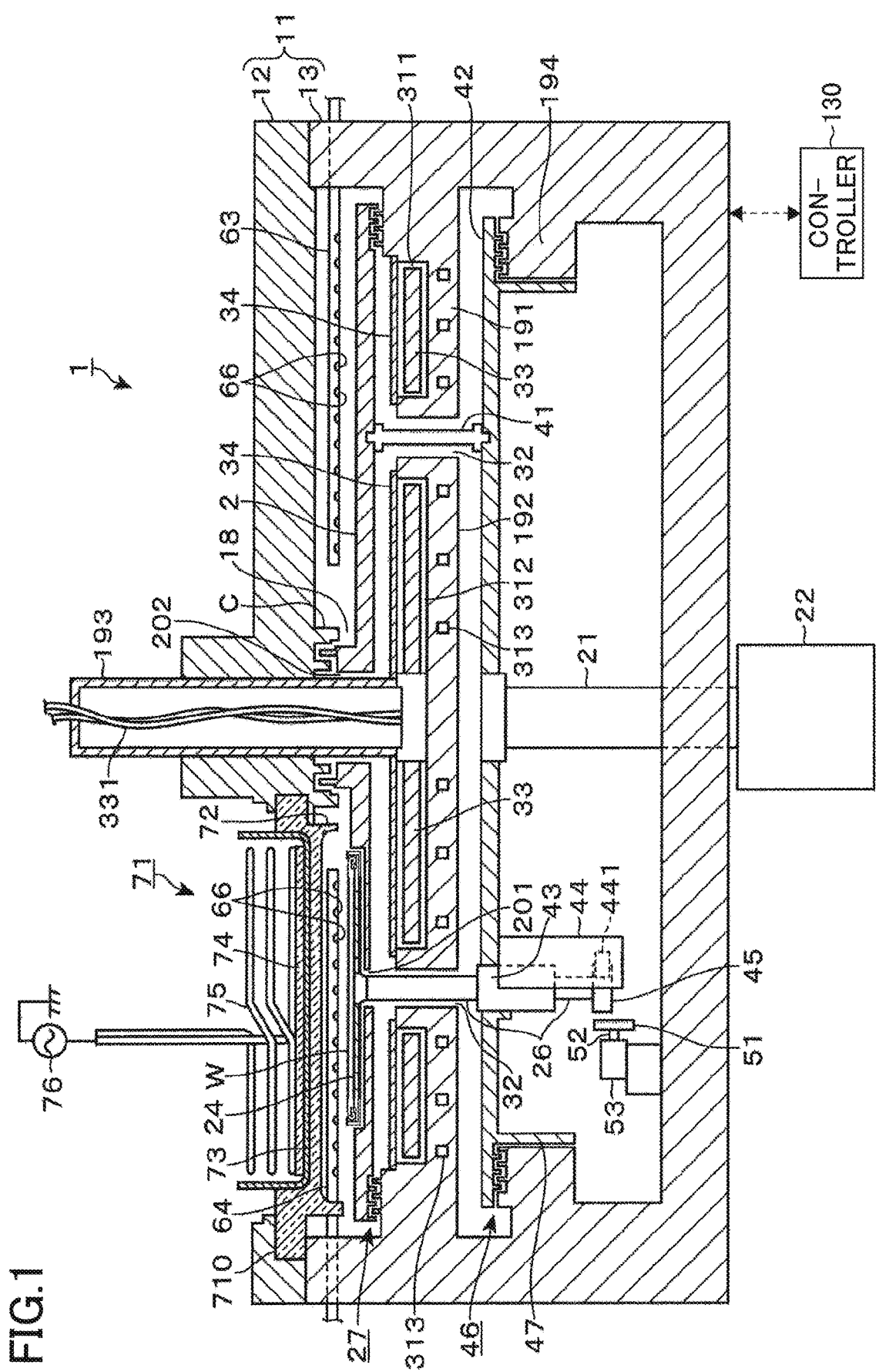
FIG. 1 is a view of a longitudinal cross section of a substrate processing apparatus used in one embodiment.
Figure 2:
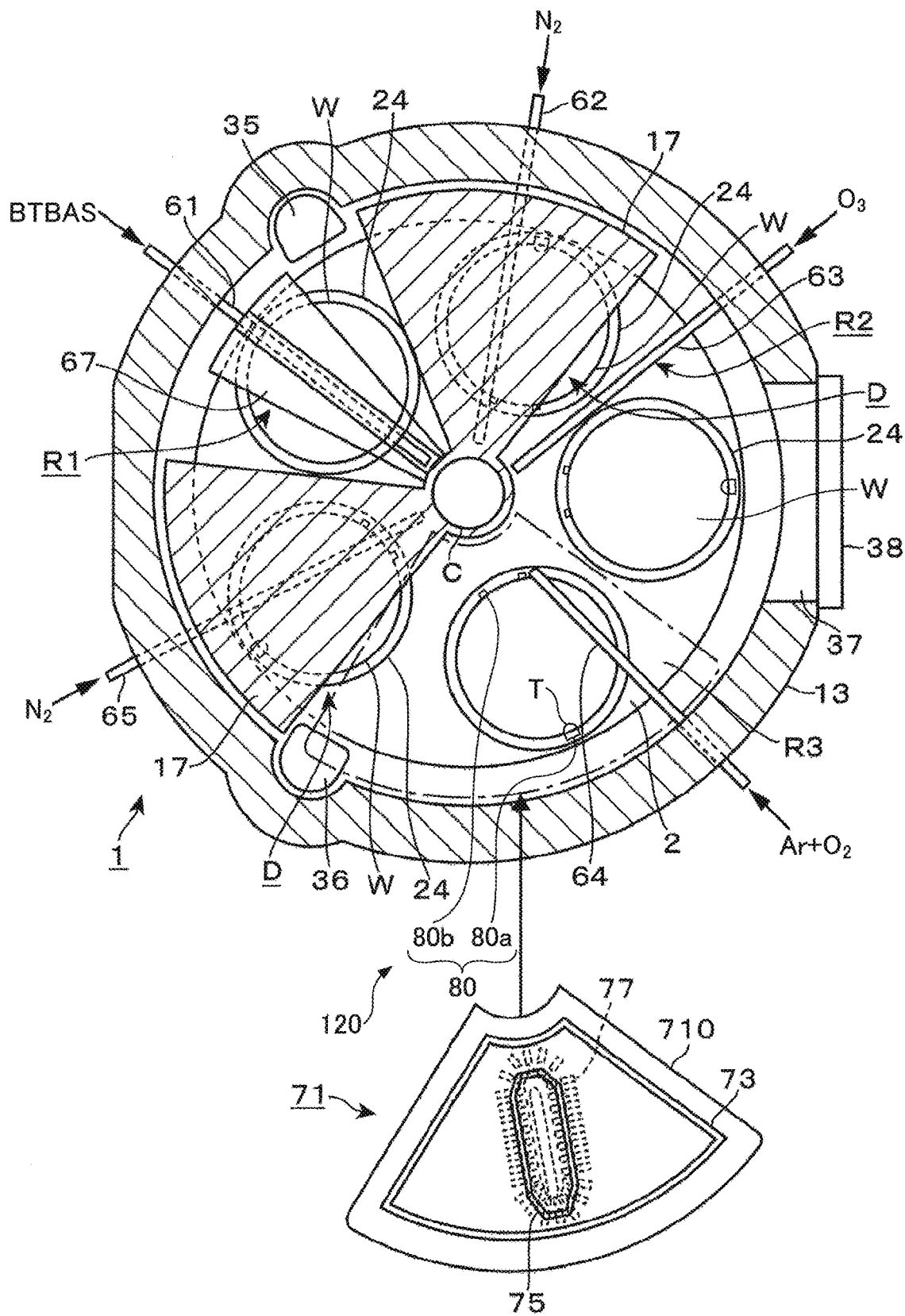
FIG. 2 is a transverse plan view of the substrate processing apparatus used in one embodiment.

FIG. 1 is a view of a longitudinal cross section of an example of the substrate processing apparatus according to one embodiment of the present disclosure. FIG. 2 is a transverse plan view illustrating a structure within a vacuum chamber of the example of the substrate processing apparatus according to one embodiment of the present disclosure, in a state where a plasma forming part is disassembled from the substrate processing apparatus.

As illustrated in FIG. 1 and FIG. 2, the film deposition apparatus 1 includes a flat vacuum chamber 11, a disk-shaped turntable 2, and a controller 130. The vacuum chamber 11 an example of a processing chamber, and has a generally circular shape in a plan view. The vacuum chamber 11 is formed by a main chamber body 13 having a top plate 12, and a sidewall and a bottom part of the vacuum chamber 11. The turntable 2 is disposed horizontally inside the vacuum chamber 11. The controller 130 is an example of a computer which may be formed by a processor (not illustrated), such as a CPU (Central Processing Unit), and a storage device (not illustrated). The processor may execute one or more programs stored in the storage device, to perform functions of the controller 130 and control operations of various parts of the film deposition apparatus 1, including gas supplies for supplying gases, drivers for driving the turntable and wafer holders, or the like. The one or more programs, when executed by the processor, may cause the processor to perform various processes including processes illustrated in FIG. 9 and FIG. 17 which will be described later, for example. The storage device may be formed by any suitable computer-readable storage medium, including a non-transitory computer-readable storage medium, such as a semiconductor memory device, a magnetic recording medium, an optical recording medium, a magneto-optical recording medium, or the like.

The turntable 2 is connected, via a support plate 42 which will be described later, to a rotating shaft 21 that extends vertically below from a position below a center part of the turntable 2. The rotating shaft 21 penetrates a bearing (not illustrated) that is provided at a bottom part of the main chamber body 13, to maintain the inside of the vacuum chamber 11 airtight from external atmosphere, and the rotating shaft 21 is connected to a driver 22 for orbital rotation disposed below the main chamber body 13. By rotating the rotating shaft 21 using the driver 22 for orbital rotation, it is possible to rotate the turntable 2 clockwise, for example, in a plan view (or top view) viewed from above the turntable 2.

A central region forming part C, and a projecting part 17 are formed on a lower surface of the top plate 12 of the vacuum chamber 11. The central region forming part C has a circular shape in the plan view, and projects downwardly so as to oppose the center part of the turntable 2. The projecting part 17 has a fan-shaped planar shape that spreads from the central region forming part C toward an outer side of the turntable 2. The central region forming part C and the projecting part 17 form, in a space inside the vacuum chamber 11, a ceiling surface that is low compared to an outer region of the vacuum chamber 11. A gap between the central region forming part C and the center part of the turntable 2 forms a passage 18 for nitrogen ($N_2$) gas. During processing of the wafer W, the $N_2$ gas is supplied from a gas supply pipe (not illustrated) toward a region inside the central region forming part C, to eject the $N_2$ gas from the passage 18 toward the entire outer periphery of the turntable 2. The $N_2$ gas has a function to prevent the source gas and the oxidation gas from contacting each other at the center part on the turntable 2.

As illustrated in FIG. 1 and FIG. 2, a wafer holder 24 for holding the substrate, is provided on the upper surface of the turntable 2. In addition, a positioning error prevention mechanism 120 for preventing a positional error of the wafer W inside the wafer holder 24, is provided on the wafer holder 24. An inner diameter of the wafer holder 24 may be set to approximately 302 mm when a diameter of the wafer W is 300 mm, for example.

As illustrated in FIG. 2, the positional error prevention mechanism 120 includes a positional error prevention member 80 for preventing the positional error of the substrate, and the positional error prevention member 80 makes contact with a side surface of the wafer W. The positional error prevention member 80 includes a first member 80a for preventing notch positional error, and a second member 80b for preventing peripheral positional error. The first member 80a makes contact with the wafer W, so as to engage a notch T of the wafer W. The second member 80b makes contact with the wafer W, so as to contact the side surface at the circular part of the wafer W. Details of the positional error prevention mechanism 120 will be described later.

Figure 3:
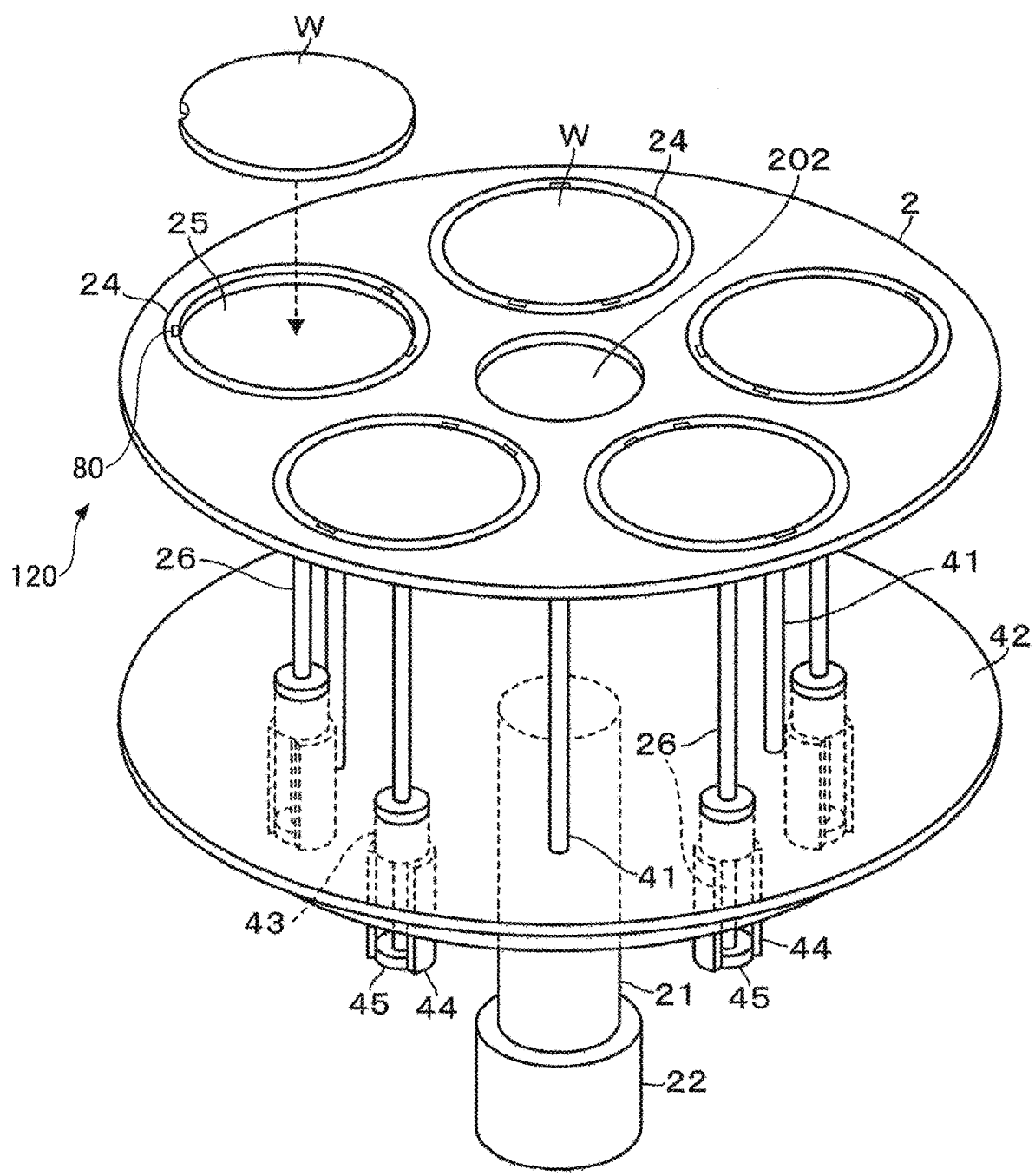
FIG. 3 is a perspective view of a turntable provided within the substrate processing apparatus used in one embodiment.

Next, a structure below the turntable 2 will be described. FIG. 3 is a perspective view of the structure under the turntable 2 provided within the example of the substrate processing apparatus according to one embodiment.

As illustrated in FIG. 1 and FIG. 3, in the film deposition apparatus 1 according to this embodiment, the turntable 2 is supported by the disk-shaped support plate 42 from below the turntable 2. Further, the support plate 42 supports the wafer holder 24 which will be described later, in a state independent from the turntable 2, and the wafer W is placed on the wafer holder 24. Hence, this structure prevents a weight of the apparatus applied to the wafer holder 24 from being applied to the turntable 2. The wafer holder 24 is a member that holds the wafer W, that is, an example of a substrate holder. In addition, the positional error prevention member 80 of the positional error prevention mechanism 120 is provided at a peripheral edge part of the wafer holder 24.

On the other hand, as illustrated in FIG. 1, the space inside the vacuum chamber 11 is partitioned into an upper space and a lower space by a peripheral sidewall part 191 and a central wall part 192, so as to independently accommodate the turntable 2 disposed above and the support plate 42 disposed below, with a gap formed therebetween, in the upper space and the lower space, respectively.

In this embodiment, the peripheral sidewall part 191 is formed by an approximately ring-shaped member that protrudes in a horizontal direction from an inner sidewall surface of the main chamber body 13 toward a center part of the main chamber body 13. The central wall part 192 is formed by an approximately disk-shaped member that is disposed in an opening in the approximately ring-shaped member forming the peripheral sidewall part 191. The central wall part 192 and the peripheral sidewall part 191 are disposed at the same height position.

As illustrated in FIG. 1, a hanging columnar support 193 is disposed to penetrate a central part of the top plate 12 in a vertical direction (that is, up-and-down direction), and the central wall part 192 is supported on the handing columnar support 193. An opening 202, that is penetrated by the hanging columnar support 193, is provided at the center part of the turntable 2 that is disposed above the central wall part 192, so that the hanging columnar support 193 that supports the central wall part 192 does not interfere with the rotation of the turntable 2, as illustrated in FIG. 3.

In addition, a diameter of the central wall part 192 is smaller than a diameter of the opening in the peripheral sidewall part 191, and a ring-shaped slit 32, that communicates the upper space and the lower space above and below the two wall parts 191 and 192, is formed between an outer peripheral surface of the central wall part 192 and an inner peripheral surface of the peripheral sidewall part 191.

According to the above-mentioned structure that partitions the internal space of the vacuum chamber 11 into the upper space and the lower space, the turntable 2 is accommodated in the upper space above the peripheral sidewall part 191 and the central wall part 192, and the support plate 42 that supports the turntable 2 or the like is accommodated in the lower space below the peripheral sidewall part 191 and the central wall part 192, as illustrated in FIG. 1.

In addition, as illustrated in FIG. 1, a ring-shaped recess 311 is formed in an upper surface of the peripheral sidewall part 191 in the plan view viewed from above the turntable 2. Further, a circular recess 312 is formed in an upper surface of the central wall part 192 in the plan view viewed from above the turntable 2. A heater 33 for heating the wafer W that is placed on the upper surface of the turntable 2, is disposed within these recesses 311 and 312. The heater 33 has a structure including a large number of heater elements arranged in a toroidal shape, where each of the heater elements is formed by an elongated tubular carbon wire heater, for example, however, the structure of the heater 33 is illustrated in a simplified manner for the sake of convenience.

Power is supplied to the heater 33 of the central wall part 192 via a feeder line 331 disposed within the hanging columnar support 193, for example. On the other hand, power is supplied to the heater 33 of the peripheral sidewall part 191 via a feeder line (not illustrated) disposed to penetrate the sidewall or the like of the main chamber body 13.

The $N_2$ gas is supplied from nozzles (not illustrated) to spaces inside the recesses 311 and 312 where the heaters 33 are disposed, to reduce the processing gas or the like entering these spaces. Moreover, openings of each of the recesses 311 and 312, opening upward, are closed by shields 34.

A coolant passage 313, through which a coolant for cooling members forming the peripheral sidewall part 191 and the central wall part 192 flows, is formed at bottom parts of the peripheral sidewall part 191 and the central wall part 192 that accommodate the heaters 33 that reach high temperatures. The above-mentioned $N_2$ gas and the coolant are respectively supplied via a N2 gas supply passage (not illustrated) and a coolant supply passage (not illustrated) that are formed within the hanging columnar support 193 and the sidewall of the main chamber body 13.

Figure 4:
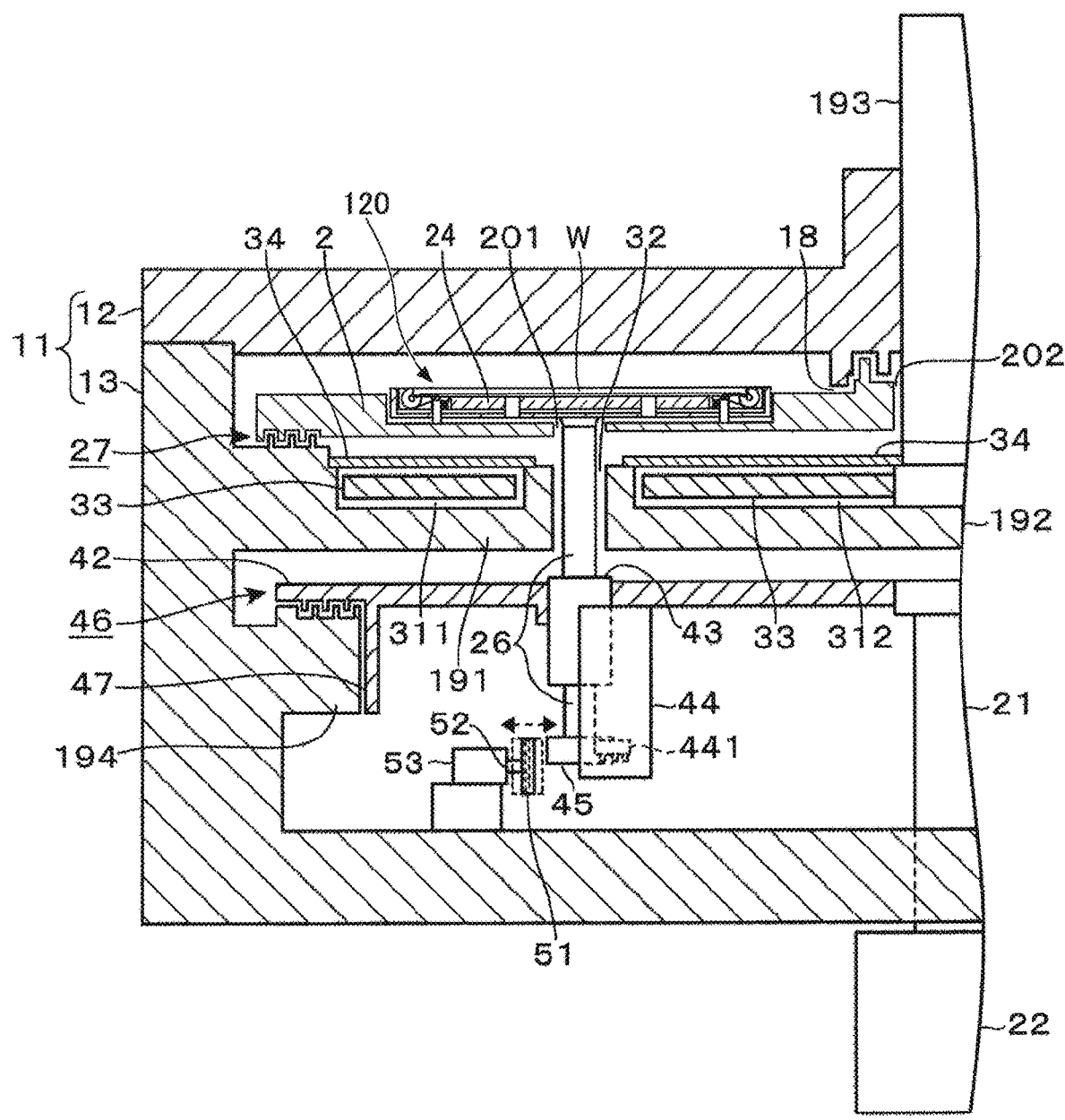
FIG. 4 is an enlarged view of the longitudinal cross section of the substrate processing apparatus used in one embodiment.

Furthermore, as illustrated in FIG. 1 and the enlarged view of the longitudinal cross section in FIG. 4, a labyrinth seal part 27 is provided between a peripheral region of the lower surface of the turntable 2 and a peripheral region of the upper surface of the peripheral sidewall part 191. The labyrinth seal part 27 is formed by a combination of a plurality of ring-shaped protrusions and grooves formed at the lower surface of the turntable 2, and a plurality of ring-shaped protrusions and grooves formed at the upper surface of the peripheral sidewall part 191. The labyrinth seal part 27 reduces the various processing gases supplied to the upper surface of the turntable 2 entering the space at the lower surface of the turntable 2. In addition, even when particles are generated at a bearing unit 43 or the like, the labyrinth seal part 27 reduces these particles entering the space above the turntable 2. The bearing unit 43 will be described later.

Moreover, as illustrated in FIG. 2, exhaust ports 35 and 36 for exhausting the inside of the vacuum chamber 11, open at the outer side of the turntable 2 in the space above the peripheral sidewall part 191 and the central wall part 192. An evacuation mechanism (not illustrated), formed by a vacuum pump or the like, is connected to each of the exhaust ports 35 and 36.

Next, the structure related to the turntable 2 will be described in more detail, by also referring to FIG. 3.

The wafer holders 24 having the circular planer shape are provided on the upper surface (that is, one side) of the turntable 2, along a rotating direction of the turntable 2. A recess 25 is formed on the upper surface of the wafer holder 24, and the wafer W in a horizontal position thereof is accommodated within the recess 25. The wafer holder 24 provides a wafer placing region where the wafer W is placed.

A plurality of posts 41 are spaced apart from each other and provided along the peripheral direction of the turntable 2, so as to extend vertically downward from positions corresponding to the slit 32 when viewed from the center of the turntable 2. As illustrated in FIG. 1, each post 41 penetrates the slit 32 and connects to the support plate 42. The support plate 42 is an example of a support accommodated within a space below the peripheral sidewall part 191 and the central wall part 192.

As illustrated in FIG. 1 and FIG. 3, a center part of a lower surface of the support plate 42 is connected to an upper end of the rotating shaft 21. Accordingly, when the rotating shaft 21 rotates, the turntable 2 rotates around a vertical shaft, via the support plate 42 and the posts 41.

Next, the structure of the wafer holder 24 will be described.

A rotating shaft 26, that supports the wafer holder 24, is provided at a center part of a lower surface of each wafer holder 24, and extends vertically downward. The rotating shaft 26 is inserted into an opening 201 that is provided in the turntable 2, and further penetrates the slit 32, to be supported by the bearing unit 43 that is fixed to the above-mentioned support plate 42. Accordingly, the wafer holder 24 is supported by the support plate 42 via the rotating shaft 26, independently of the turntable 2.

The bearing unit 43 includes a bearing (not illustrated) for rotatably supporting the rotating shaft 26, and a magnetic seal (not illustrated) for preventing scattering of particles from the bearing. A lower part of the rotating shaft 26 penetrates the bearing unit 43, to extend to the lower surface of the support plate 42. A driven gear part 45, which will be described later, is provided on a lower end of the rotating shaft 26, below the support plate 42.

As illustrated in FIG. 1 and FIG. 4, a peripheral region of the lower surface of the support plate 42 is disposed to oppose an upper surface of a generally ring-shaped projection 194 that is provided to project in the horizontal direction from the inner wall surface of the main chamber body 13 toward the center part of the main chamber body 13. A labyrinth seal part 46 is provided between the support plate 42 and the projection 194. The labyrinth seal part 46 is formed by a combination of a plurality of ring-shaped protrusions and grooves formed at the lower surface of the support plate 42, and a plurality of ring-shaped protrusions and grooves formed at an upper surface of the projection 194.

Further, a tubular wall part 47 is formed on the inner side of the labyrinth seal part 46, so as to extend downward from the lower surface of the support plate 42. The tubular wall part 47 is inserted into the inner side of the projection 194, and thus, a narrow gap is formed between an outer peripheral surface of the tubular wall part 47 and an inner peripheral surface of the projection 194.

The labyrinth seal part 46 and the tubular wall part 47 reduce the various processing gases entering the space at the lower surface of the support plate 42 from the upper surface of the support plate 42. In addition, even when the particles are generated at the bearing unit 43 or at a rotation driver 53 which will be described later, the labyrinth seal part 46 and the tubular wall part 47 reduce these particles entering the space above the support plate 42.

As illustrated in FIG. 4, the positioning error prevention mechanism 120 is provided on a side surface on the outer side of the wafer placing region of the wafer holder 24.

Other structures related to the vacuum chamber 11 will be described. As illustrated in FIG. 2, a transport port 37 for the wafer W, and a gate valve 38 that opens and closes the transport port 37, are provided on the sidewall of the main chamber body 13. The wafer W can be transferred between an external transport mechanism and the wafer holder 24, by moving the transport mechanism inside the vacuum chamber 11 through the transport port 37. More particularly, through-holes are formed to penetrate, in the vertical direction, the bottom surface of the recess 25 of each wafer holder 24, and the bottom parts of the peripheral sidewall part 191, the support plate 42, and the main chamber body 13, when the wafer holder 24 is moved to a position opposing the transport port 37. An elevator pin (not illustrated) moves up and down within each of the through-holes, and an upper end of the elevator pin moves up and down between the upper surface of the recess 25 and the lower side of the support plate 42. The wafer W is transferred via the elevator pins. The illustration of the elevator pins and each of the through-holes is omitted for the sake of convenience.

In addition, as illustrated in FIG. 1 and FIG. 2, a source gas nozzle 61, a separation gas nozzle 62, an oxidation gas nozzle 63, a plasma generation gas nozzle 64, and a separation gas nozzle 65 are spaced apart from each other, and disposed in this order along the rotating direction of the turntable 2. Each of the gas nozzles 61 through 65 is formed to a rod shape that extends horizontally along a radial direction of the turntable 2, and ejects a corresponding one of the various gases downward, from a large number of ejection ports 66 that are spaced apart from each other and disposed along the radial direction. In this specification, the source gas may also be referred to as a first gas, and the oxidation gas may also be referred to as a second gas. Further, the source gas nozzle 61 may also be referred to as a first gas supply, the oxidation gas nozzle 63 may also be referred to as a second gas supply, and the separation gas nozzle 62 may also be referred to as a separation gas supply.

The source gas nozzle 61 ejects the above-mentioned Bis-Tertiary Butyl Amino Silane (BTBAS) gas. As illustrated in FIG. 2, a nozzle cover 67 may be provided, if necessary, to cover the source gas nozzle 61. The nozzle cover 67 has a fan shape that extends from the source gas nozzle 61 to an upstream side and a downstream side along the rotating direction of the turntable 2. The nozzle cover 67 has a function to increase a concentration of the BTBAS gas under the nozzle cover 67, and increase adsorptivity of the BTBAS gas on the wafer W. In addition, the oxidation gas nozzle 63 ejects the above-mentioned $O_3$ gas. The separation gas nozzles 62 and 65 eject the $N_2$ gas. In the plan view viewed from above the turntable 2, the separation gas nozzles 62 and 65 are disposed at positions respectively dividing the fan-shaped projecting part 17 of the top plate 12 along the peripheral direction.

The plasma generation gas nozzle 64 ejects a plasma generation gas which may be a gas mixture of argon (Ar) gas and oxygen ($O_2$) gas, for example.

In the plan view, a fan-shaped opening is provided in the top plate 12 along the rotating direction of the turntable 2. A plasma forming part 71 is provided to cover this fan-shaped opening in the top plate 12. The plasma forming part 71 includes a cup-shaped main body 710 made of a dielectric, such as quartz or the like. This cup-shaped main body 710 closes the fan-shaped opening in the top plate 12. When viewed in the rotating direction of the turntable 2, the plasma forming part 71 is provided between the oxidation gas nozzle 63 and the projecting part 17. FIG. 2 illustrates the position where the plasma forming part 71 is provided, by a one-dot chain line.

As illustrated in FIG. 1, a protruding part 72 is provided on a lower surface of the main body 710, to protrude downward along the above-mentioned fan-shaped opening. A tip end of the plasma generation gas nozzle 64 enters inside a region surrounded by the protruding part 72, from the outer periphery of the turntable 2, so that the gas can be ejected into the region surrounded by this protruding part 72. The protruding part 72 has a function to reduce the $N_2$ gas, the $O_3$ gas, and the BTBAS gas entering below a plasma processing region R3, and reduce a decrease in the concentration of the plasma generation gas.

A recess is formed in an upper surface of the main body 710 of the plasma forming part 71, and a box-shaped Faraday shield (or Faraday cage) 73 that opens upwards is disposed inside this recess. An antenna 75 that is formed by a coiled metal wire wound around a vertical axis, is provided on a bottom part of the Faraday shield 73 via an insulating plate member 74. A high-frequency power supply 76 is electrically connected to the antenna 75.

In addition, slits 77 are formed in the bottom surface of the Faraday shield 73. The slits 77 are provided to prevent an electric field component of an electromagnetic field generated from the antenna 75 from extending downward upon application of the high-frequency power to the antenna 75, and to guide a magnetic field component downwards. As illustrated in FIG. 2, a large number of slits 77 are formed along a winding direction of the antenna 75, and each slit 77 extends in a direction perpendicular to (or crossing or traversing) the winding direction of the antenna 75.

When the plasma forming part 71 having the above-mentioned structure is used, and the high-frequency power supply 76 is turned on to apply the high-frequency power to the antenna 75, it is possible to plasmatize the plasma generation gas supplied below the plasma forming part 71.

For the sake of convenience, in the enlarged view of the longitudinal cross section in FIG. 4, the illustration of the plasma forming part 71, and the plasma generation gas nozzle 64 and the coolant passage 313 below the plasma forming part 71, is omitted.

On the turntable 2, a region below the nozzle cover 67 of the source gas nozzle 61 forms an adsorption region R1 where the adsorption of the source gas, that is, the BTBAS gas, takes place. On the turntable 2, a region below the oxidation gas nozzle 63 forms an oxidation region R2 where oxidation of the BTBAS gas by the $O_3$ gas takes place. In addition, on the turntable 2, a region below the plasma forming part 71 forms a plasma processing region R3 where reforming of the $SiO_2$ film by the plasma takes place. On the turntable 2, a region below the projecting part 17 forms a separation region D where the adsorption region R1 and the oxidation region R2 are separated from each other by the $N_2$ gas ejected from the separation gas nozzles 62 and 65, to prevent mixture of the source gas and the oxidation gas.

The above-mentioned exhaust port 35, provided in the main chamber body 13, opens to the outer side between the adsorption region R1 and the adjacent separation region D that is located on the downstream side of the adsorption region R along the rotating direction, and exhausts excess BTBAS gas. In addition, the exhaust port 36, provided in the main chamber body 13, opens to the outer side near a boundary between the plasma processing region R3 and the adjacent separation region D that is located on the downstream side of the plasma processing region R3 along the rotating direction, and exhausts excess $O_3$ gas and excess plasma generation gas. Each of the exhaust ports 35 and 36 also exhausts the $N_2$ gas that is supplied from each of the separation regions D and the central region forming part C of the turntable 2.

In the film deposition apparatus 1 having the structure described heretofore, when rotating the turntable 2 to cause the wafer W, placed on each wafer holder 24, to undergo an orbital rotation around the rotating shaft 21 that extends in the vertical direction, each wafer holder 24 can rotate around the rotating shaft 26 that extends in the vertical direction and supports the center part of the lower surface of each wafer holder 24.

Next, a mechanism that rotates the wafer holder 24 will be described in more detail, by referring to FIG. 4, FIG. 5, or the like.

Figure 5:
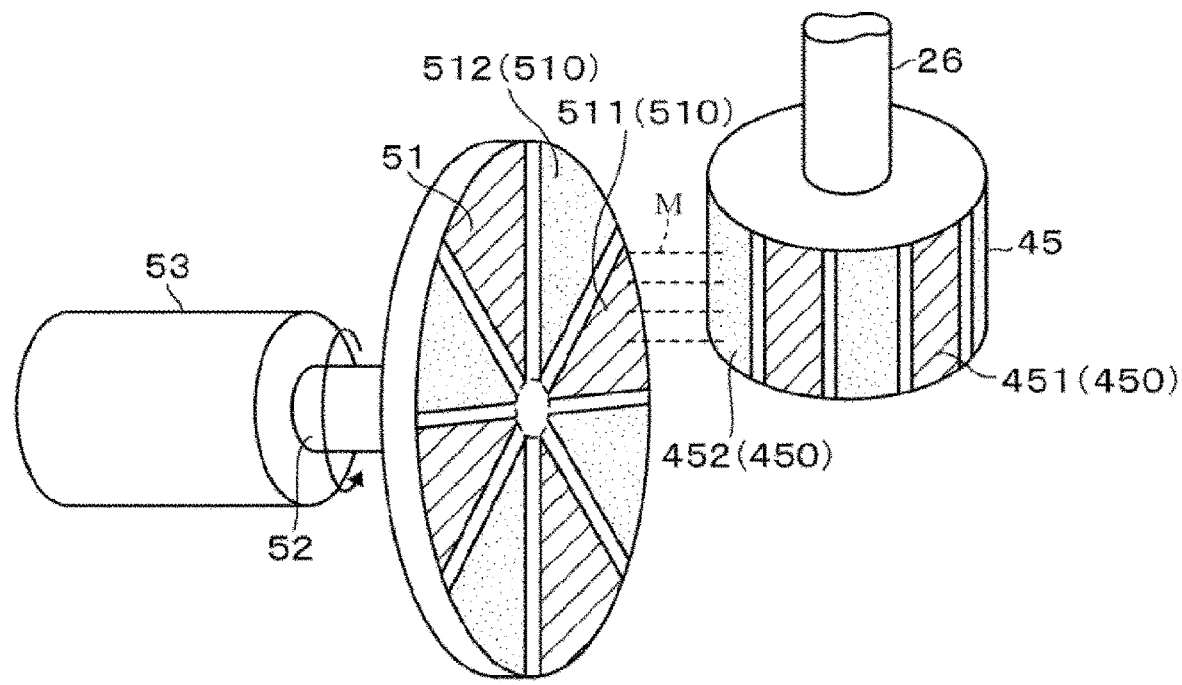
FIG. 5 is an enlarged perspective view of a magnetic gear mechanism that causes a stage, provided on the turntable to rotate.

As illustrated in FIG. 4 and FIG. 5, the lower end of the rotating shaft 26 that penetrates the bearing unit 43, is supported on an upper surface of the flat cylindrical driven gear part 45 in a state where center axes of the rotating shaft 26 and the driven gear part 45 match. Accordingly, the driven gear part 45 is linked to the wafer holder 24 via the rotating shaft 26. In addition, because the bearing unit 43 rotatably supports the rotating shaft 26, each wafer holder 24 can be rotated around the rotating shaft 26 when the driven gear part 45 is rotated in the peripheral direction.

As illustrated in FIG. 5, a plurality of permanent magnets 450 are spaced apart from each other and disposed on an outer peripheral surface of the driven gear part 45. The permanent magnets 450 are disposed so that north poles (N-poles) and south poles (S-poles) thereof are alternately arranged on the outer peripheral surface of the driven gear part 45. In other words, between two mutually adjacent permanent magnets 450, the polarities of magnetic poles exposed at the outer peripheral surface of the driven gear part 45 are mutually different. As an example, between first and second permanent magnets 450 that are adjacent to each other, a N-pole surface 451 of the first permanent magnet 450 and a S-pole surface 452 of the second permanent magnet 450 are exposed at the outer peripheral surface of the driven gear part 45, as illustrated in FIG. 5. In addition, the N-pole surface 451 and the S-pole surface 452 are formed as strips respectively extending in the vertical direction from an upper edge toward a lower edge of the outer peripheral surface of the driven gear part 45, for example. The outer peripheral surface of the driven gear part 45, having the plurality of permanent magnets 450 disposed thereon, corresponds to a driven surface of the driven gear part 45.

Figure 6:
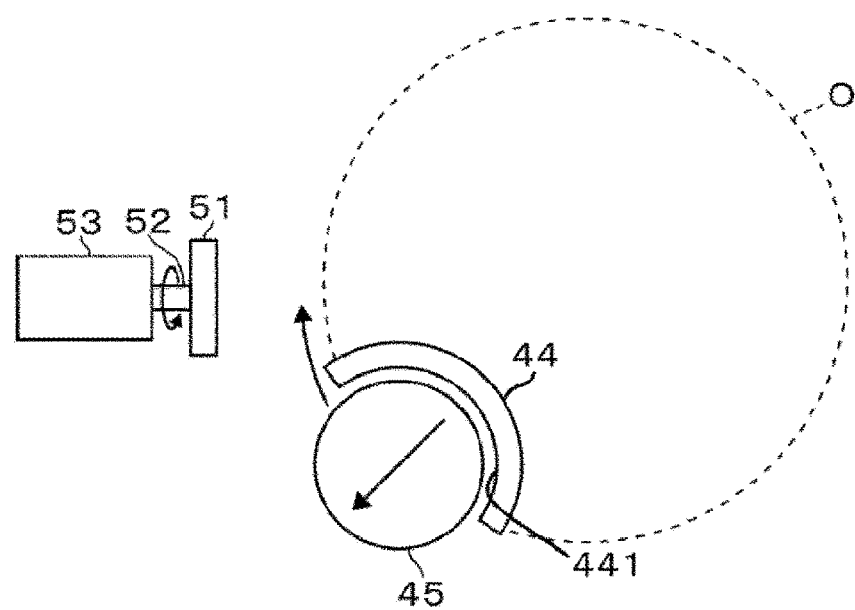
FIG. 6 is a diagram illustrating a first action of the magnetic gear mechanism.
Figure 7:
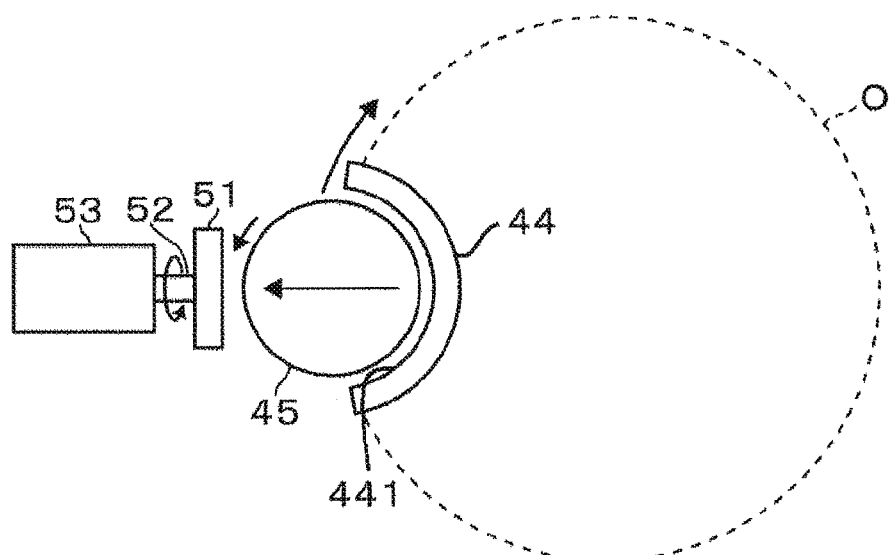
FIG. 7 is a diagram illustrating a second action of the magnetic gear mechanism.
Figure 8:
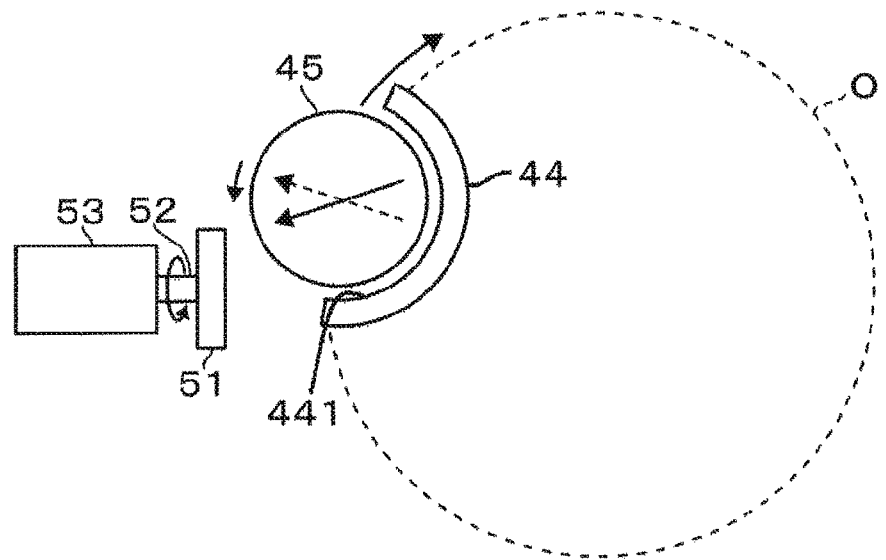
FIG. 8 is a diagram illustrating a third action of the magnetic gear mechanism.

As described above, the rotating shaft 26, that is connected to the driven gear part 45, is supported by the support plate 42 which also supports the turntable 2. Hence, when the turntable 2 is rotated, each rotating shaft 26 undergoes an orbital rotation around the rotating shaft 21 along the slit 32. Accordingly, the driven gear part 45 that is provided on the lower end of the rotating shaft 26 also moves along a moving locus O corresponding to the slit 32. The moving locus O is indicated by a dotted line in FIG. 6 through FIG. 8.

As illustrated in FIG. 4, a disk-shaped driving gear part 51, that rotates the driven gear part 45 in the peripheral direction, is disposed on the bottom part of the main chamber body 13, positioned below the support plate 42. The disk-shaped driving gear part 51 is disposed at a position so that, when the driven gear part 45 passes a predetermined position on the moving locus O, a first surface of the disk-shaped driving gear part 51 opposes the outer peripheral surface (or driven surface) of the driven gear part 45.

As illustrated in FIG. 5, a plurality of permanent magnets 510 are spaced apart from each other and disposed on the first surface of the disk-shaped driving gear part 51. The permanent magnets 510 are disposed so that N-poles and S-poles thereof are alternately arranged on the first surface of the disk-shaped driving gear part 51. In other words, between two mutually adjacent permanent magnets 510, the polarities of magnetic poles exposed at the first surface of the disk-shaped driving gear part 51 are mutually different. As an example, between first and second permanent magnets 510 that are adjacent to each other, a N-pole surface 511 of the first permanent magnet 510 and a S-pole surface 512 of the second permanent magnet 510 are exposed at the first surface of the disk-shaped driving gear part 51, as illustrated in FIG. 5.

In addition, the N-pole surfaces 511 and the S-pole surfaces 512, exposed at the first surface of the disk-shaped driving gear part 51, have fan shapes that spread from a center part toward a peripheral edge part on the first surface of the disk-shaped driving gear part 51, so as to overlap with the shapes of the N-pole surfaces 451 and the S-pole surfaces 452 formed on the outer peripheral surface of the driven gear part 45 when the driven gear part 45 passes a region opposing the first surface of the disk-shaped driving gear part 51. The first surface of the disk-shaped driving gear part 51, having the plurality of permanent magnets 510 disposed thereon, corresponds to a driving surface of the disk-shaped driving gear part 51.

One end of a driving shaft 52 is connected to a center part of a second surface of the disk-shaped driving gear part 51, opposite from the first surface having the permanent magnets 510 disposed thereon. The rotation driver 53 is provided on the other end of the driving shaft 52. The disk-shaped driving gear part 51 can be rotated around a rotating center thereof, by rotating the driving shaft 52 using the rotation driver 53. As illustrated in FIG. 5, the driving shaft 52 of the disk-shaped driving gear part 51 is disposed to extend in a direction intersecting the rotating shaft 26 that connects to the driven gear part 45.

Further, the rotation driver 53 can move, back and forth as indicated arrows in FIG. 4, a tip end position of the driving shaft 52 that is connected to the disk-shaped driving gear part 51. As a result, as indicated by the dotted line in FIG. 4, it is possible to adjust a gap (or distance) between the first surface (or driving surface) of the disk-shaped driving gear part 51 and the outer peripheral surface (or driven surface) of the driven gear part 45. The rotation driver 53 that moves the tip end position of the driving shaft 52 also functions as a position adjuster of this embodiment.

The disk-shaped driving gear part 51 is disposed at a height position so that, when the driven gear part 45 passes the position opposing the disk-shaped driving gear part 51, the outer peripheral surface of the driven gear part 45 passes above the center part on the first surface of the disk-shaped driving gear part 51. As a result, the permanent magnet 450 provided on the driven gear part 45 and the permanent magnet 510 provided on the disk-shaped driving gear part 51 become close to each other as illustrated in FIG. 5, and relatively strong magnetic field lines M are formed between the N-pole surface 511 and the S-pole surface 451, or between the S-pole surface 512 and the N-pole surface 451.

When the disk-shaped driving gear part 51 is rotated (that is, the driving surface is moved) so that the permanent magnet 510 of the disk-shaped driving gear part 51 moves opposite to the moving direction of the permanent magnet 450 of the driven gear part 45, for example, the magnetic field lines M move to rotate the driven gear part 45. As a result, the rotation of the driven gear part 45 is transmitted to the wafer holder 24 via the rotating shaft 26, to enable the wafer holder 24 to rotate.

The driven gear part 45 and the disk-shaped driving gear part 51, the rotating shaft 26 that links the driven gear part 45 and the wafer holder 24, the driving shaft 52 that drives the disk-shaped driving gear part 51, the rotation driver 53, or the like form a magnetic gear mechanism according to this embodiment.

In addition, as illustrated in FIG. 3, FIG. 4, or the like, a semi-cylindrical sidewall part 44 is provided on the lower surface of the support plate 42, to surround the bearing unit 43, the rotating shaft 26, and a part of the outer peripheral surface of the driven gear part 43 that protrude downward from the lower surface of the support plate 42. The sidewall part 44 is provided to surround the outer peripheral surface of the driven gear part 45, on the side opposite from the side where the disk-shaped driving gear part 51 is disposed.

A semi-annular brake part 441, made of a ferromagnetic material, for example, is provided at a lower part of an inner peripheral surface of the sidewall part 44. A distance between the outer peripheral surface of the driven gear part 45 and the brake part 441, or the like, is adjusted so that magnetic field lines formed between the permanent magnet 450 of the driven gear part 45 and the brake part 441 become weaker than the magnetic field lines M formed between the driven gear part 45 and the disk-shaped driving gear part 51.

As a result, when the driven gear part 45 passes the position opposing the disk-shaped driving gear part 51, it is possible to rotate the driven gear part 45 by a force acting between the driven gear part 45 and the disk-shaped driving gear part 51. On the other hand, after the driven gear part 45 passes the position opposing the disk-shaped driving gear part 51, it is possible to reduce free rotation of the driven gear part 45 due to inertial force or the like, by the force acting between the driven gear part 45 and the brake part 441. The inner peripheral surface of the brake part 441 surrounding the outer peripheral surface of the driven gear part 45, corresponds to a braking surface for stopping the rotation of the driven gear part 45.

By using a rotating mechanism described heretofore, it is possible to rotate the wafer holder 24 in addition to rotating the turntable 2, and improve an in-plane uniformity of the film thickness distribution. In other words, because the wafer holders 24 are arranged along the peripheral direction of the turntable 2, the wafers W set inside the respective wafer holders 24 have different moving velocities depending on positions on the wafers W, due to different distances to these positions from the center of the turntable 2. In other words, the moving velocity at the position near a rotating center of the turntable 2 is slow, while the moving velocity at a position near the outer periphery of the turntable 2 is fast. Consequently, when the film deposition process is performed, the film deposition process becomes different depending on the position in the radial direction of the turntable 2. However, even in such cases, the wafers W move near the rotating center of the turntable 2 and also move near the outer periphery of the turntable 2, and as a whole, the film deposition process can be performed uniformly, to improve the in-plane uniformity of the film thickness distribution.

As described above, the in-plane uniformity of the film thickness distribution can be improved by the simultaneous rotation and orbital rotation. However, due to further refinements (or size reductions) or the like of semiconductor devices, there are demands to further improve the uniformity of the thickness distribution of the film that is deposited.

[Substrate Processing Method]

Next, a substrate processing method according to this embodiment will be described. The substrate processing method according to this embodiment may be implemented in the substrate processing apparatus cable of causing simultaneous rotation and orbital rotation of the wafer which is an example of the substrate. When depositing a film on the surface of the wafer W by the substrate processing apparatus in this embodiment, the direction of the orbital rotation of the turntable 2 is reversed while maintaining the rotation of the wafer W.

Figures 9, 10:
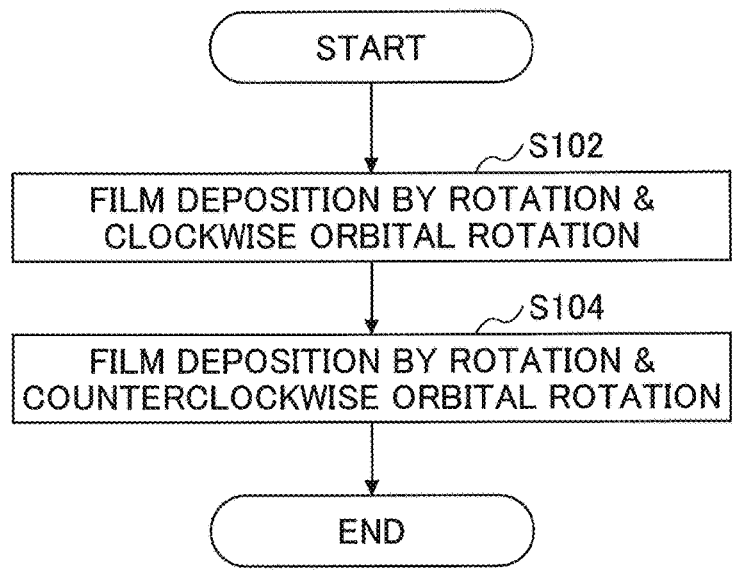
FIG. 9 is a flow chart illustrating a substrate processing method according to an embodiment.
FIG. 10 is a diagram for explaining a thickness of a film that is deposited when the turntable is caused to undergo an orbital rotation while a wafer is rotated.

The substrate processing method according to this embodiment will be described, by referring to FIG. 9.

First, in the substrate processing method according to this embodiment, when the process starts, a film deposition process is performed in step S102 by causing the wafer holder 24 to rotate, and causing the turntable 2 to undergo the clockwise orbital rotation in a state where the wafer W rotates. Hence, in the substrate processing apparatus illustrated in FIG. 2, the wafer W moves past the adsorption region R1, the oxidation region R2, and the plasma processing region R3 in this order.

Next, the film deposition process is performed in step S104 by causing the wafer holder 24 to rotate, and causing the turntable 2 to undergo the counterclockwise orbital rotation in the state where the wafer W rotates, and the process ends. Thus, in the substrate processing apparatus illustrated in FIG. 2, the wafer W moves past the oxidation region R2, the adsorption region R1, and the plasma processing region R3 in this order.

Next, the substrate processing method according to this embodiment will be described in more detail, by referring to FIG. 10.

When the turntable 2 is caused to undergo the clockwise orbital rotation while the wafer W rotates, the wafer W moves past the adsorption region R1, the oxidation region R2, and the plasma processing region R3 in this order in the substrate processing apparatus illustrated in FIG. 2. In this state, when the silicon oxide film is deposited for 34.2 minutes, the silicon oxide film deposited on the wafer W has an average film thickness (AVG) of 21.01 nm, a maximum value (Max) of the film thickness of 21.37 nm, and a minimum value (Min) of the film thickness of 20.93 nm, as illustrated in FIG. 10. From these results, a difference (Max−Min) between the maximum value (Max) of the film thickness and the minimum value (Min) of the film thickness is 0.44 nm, and a value of the film thickness distribution obtained from (Max−Min)/AVG is 1.052%, as illustrated in FIG. 10.

In addition, when the turntable 2 is caused to undergo the counterclockwise orbital rotation while the wafer W rotates, the wafer W moves past the oxidation region R2, the adsorption region R1, and the plasma processing region R3 in this order in the substrate processing apparatus illustrated in FIG. 2. In this state, when the silicon oxide film is deposited for 34.2 minutes, the silicon oxide film deposited on the wafer W has the average film thickness (AVG) of 17.93 nm, the maximum value (Max) of the film thickness of 18.10 nm, and the minimum value (Min) of the film thickness of 17.71 nm, as illustrated in FIG. 10. From these results, the difference (Max−Min) between the maximum value (Max) of the film thickness and the minimum value (Min) of the film thickness is 0.39 nm, and the value of the film thickness distribution obtained from (Max−Min)/AVG is 1.093%, as illustrated in FIG. 10.

Accordingly, when the turntable 2 is simply caused to undergo the clockwise orbital rotation or the counterclockwise orbital rotation while the wafer W rotates, the value of the film thickness distribution is 1% or higher.

When the turntable 2 is caused to undergo the clockwise orbital rotation while the wafer W rotates, the thickness distribution on the wafer W becomes concentric as illustrated in FIG. 11, such that the film is thicker at the center part of the wafer W than at the peripheral part of the wafer W. On the other hand, when the turntable 2 is caused to undergo the counterclockwise orbital rotation while the wafer W rotates, the thickness distribution on the wafer W becomes concentric as illustrated in FIG. 12, such that the film is thicker at the peripheral part of the wafer W than at the center part of the wafer W.

A simulation was carried out to deposit the film on the wafer W by causing the turntable 2 to undergo the clockwise orbital rotation for one-half of the total film deposition time while the wafer W rotates, and by causing the turntable 2 to undergo the counterclockwise orbital rotation for the remaining one-half of the total film deposition time while the wafer W rotates. More particularly, the simulation was carried out by setting each of a film deposition time in which the turntable 2 is caused to undergo the clockwise orbital rotation, and a film deposition time in which the turntable 2 is caused to undergo the counterclockwise orbital rotation, to 17.2 minutes, so that the total film deposition time is 34.4 minutes. As a result, the silicon oxide film deposited on the wafer W has the average film thickness (AVG) of 19.47 nm, and the value of the film thickness distribution obtained from (Max−Min)/AVG is 0.685%, as illustrated in FIG. 13. This value of the film thickness distribution is low compared to the case where the turntable 2 is caused to undergo the clockwise orbital rotation while the wafer W rotates, and is also low compared to the case where the turntable 2 is caused to undergo the counterclockwise orbital rotation while the wafer W rotates. As illustrated in FIG. 13, in this example, the average film thickness (AVG) or the like for the case where the turntable 2 is caused to undergo the clockwise orbital rotation while the wafer W rotates, and the average film thickness (AVG) or the like for the case where the turntable 2 is caused to undergo the counterclockwise orbital rotation while the wafer W rotates, are approximately one-half of the corresponding values in the example illustrated in FIG. 10.

In general, the value of the film thickness distribution is averaged when one-half of the total film deposition time deposits the film by causing the turntable 2 to undergo the clockwise orbital rotation, and the remaining one-half of the total film deposition time deposits the film by causing the turntable 2 to undergo the counterclockwise orbital rotation. For this reason, the value of the film thickness distribution becomes approximately an intermediate value between the value of the film thickness distribution for the case where the film is deposited by causing the turntable 2 to undergo the clockwise orbital rotation, and the value of the film thickness distribution for the case where the film is deposited by causing the turntable 2 to undergo the counterclockwise orbital rotation. For example, the value of the film thickness distribution of the silicon oxide film is 7.58% for the case where the silicon oxide film is deposited by causing the turntable 2 to undergo the clockwise rotation without rotating the wafer W. In addition, the value of the film thickness distribution of the silicon oxide film is 11.70% for the case where the silicon oxide film is deposited by causing the turntable 2 to undergo the counterclockwise rotation without rotating the wafer W. The value of the film thickness distribution of the silicon oxide film is 9.20% for the case where the silicon oxide film is deposited by causing the turntable 2 to undergo the clockwise rotation without rotating the wafer W during one-half of the total film deposition time, and the silicon oxide film is deposited by causing the turntable 2 to undergo the counterclockwise rotation without rotating the wafer W during the remaining one-half of the total film deposition time. This value of the film thickness distribution, which is 9.20%, is close to an intermediate value between the value of the film thickness distribution for the case where the silicon oxide film is deposited by causing the turntable 2 to undergo the clockwise orbital rotation without rotting the wafer W, and the film thickness distribution for the case where the silicon oxide film is deposited by causing the turntable 2 to undergo the counterclockwise orbital rotation without rotating the wafer W.

On the other hand, as illustrated in FIG. 13, when the film is deposited by causing the turntable 2 to undergo the clockwise rotation while rotating the wafer W during one-half of the total film deposition time, and the film is deposited by causing the turntable 2 to undergo the counterclockwise rotation while rotating the wafer W during the remaining one-half of the total film deposition time, the value of the film thickness distribution becomes low compared to the case where the film is deposited by simply causing the turntable to undergo the clockwise orbital rotation, and is also low compared to the case where the film is deposited by simply causing the turntable to undergo the counterclockwise orbital rotation. FIG. 14 illustrates the film thickness distribution of the wafer when the silicon oxide film is deposited by the film deposition method according to this embodiment.

As illustrated in FIG. 11, when the turntable 2 is caused to undergo the clockwise orbital rotation while the wafer W rotates, the deposited film becomes thicker at the center part of the wafer W than at the peripheral part of the wafer W. On the other hand, as illustrated in FIG. 12, when the turntable 2 is caused to undergo the counterclockwise orbital rotation while the wafer W rotates, the deposited film becomes thicker at the peripheral part of the wafer W than at the center part of the wafer W. For this reason, the film thickness distribution can be made uniform at the center part and the peripheral part of the wafer W, by performing the film deposition by casing the turntable 2 to undergo the clockwise orbital rotation while the wafer W rotates, and performing the film deposition by casing the turntable 2 to undergo the counterclockwise orbital rotation while the wafer W rotates.

Figure 15:
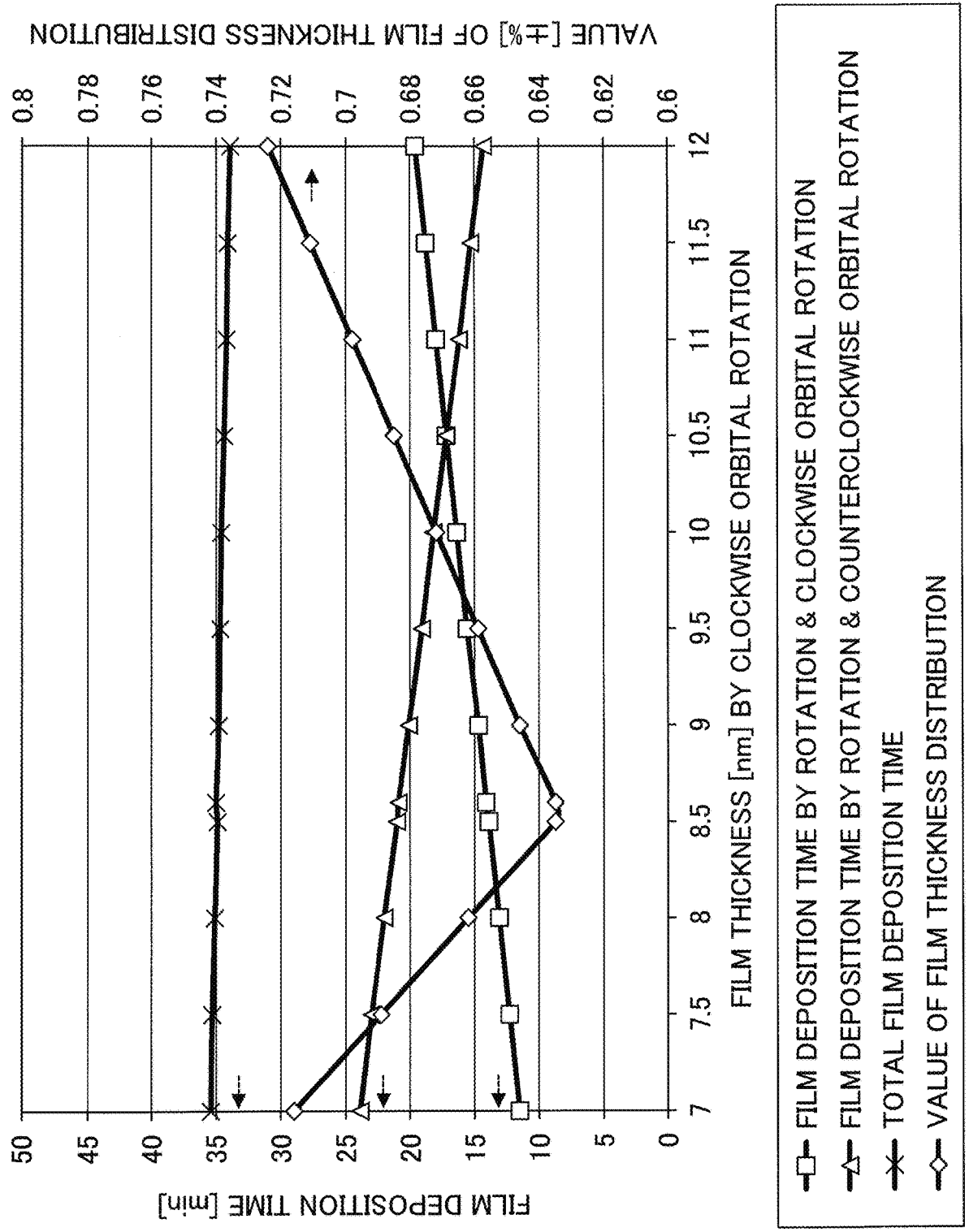
FIG. 15 is a diagram for explaining the film that is deposited by the substrate processing method according to the embodiment.

FIG. 15 illustrates the film that is deposited while rotating the wafer W, by varying a ratio of the film thickness deposited by causing the turntable 2 to undergo the clockwise orbital rotation, and the film thickness deposited by causing the turntable 2 to undergo the counterclockwise orbital rotation. More particularly, the proportion of the film deposition time in which the turntable 2 is caused to undergo the clockwise orbital rotation while the wafer W rotates, and the film deposition time in which the turntable 2 is caused to undergo the counter clockwise orbital rotation while the wafer W rotates, is varied so that the film thickness of the silicon oxide film that is deposited becomes 19.37 nm. In FIG. 15, the abscissa indicates the film thickness of the silicon oxide film that is deposited by the clockwise orbital rotation of the turntable 2, the left ordinate indicates the total film deposition time, and the right ordinate indicates the value of the film thickness distribution. Based on FIG. 15, the value of the film thickness distribution becomes lower for the case where the film deposition time by the counterclockwise orbital rotation of the turntable 2 is slightly longer than the film deposition time by the clockwise orbital rotation of the turntable 2, when compared to the case where the film deposition time by the clockwise orbital rotation of the turntable 2 and the film deposition time by the counterclockwise orbital rotation of the turntable 2 are the same (particularly when the film deposition time is 17.2 minutes). In addition, the value of the film thickness distribution becomes ±0.685%, which is the lowest, for the case where the film thickness deposited by the clockwise orbital rotation of the turntable 2 is approximately 8.5 nm. In this case, the film deposition time by the clockwise orbital rotation of the turntable 2 is 14 minutes, and the deposition time by the counterclockwise orbital rotation of the turntable 2 is 21 minutes, and the total film deposition time is 35 minutes.

FIG. 16 illustrates the film thickness of the silicon oxide film and the value of the film thickness distribution for the case described immediately above. The silicon oxide film deposited on the wafer W in this case has the average film thickness (AVG) of 19.47 nm, the maximum value (Max) of the film thickness of 19.55 nm, and the minimum value (Min) of the film thickness of 19.30 nm, as illustrated in FIG. 16. From these results, the difference (Max−Min) between the maximum value (Max) of the film thickness and the minimum value (Min) of the film thickness is 0.25 nm, and the value of the film thickness distribution obtained from (Max−Min)/AVG is 0.635%, as illustrated in FIG. 16.

The silicon oxide film deposited on the wafer W for 14 minutes in the case where the turntable 2 is caused to undergo the clockwise orbital rotation while the wafer W rotates, has the average film thickness (AVG) of 8.50 nm, the maximum value (Max) of the film thickness of 8.65 nm, and the minimum value (Min) of the film thickness of 8.47 nm, as illustrated in FIG. 16. From these results, the difference (Max−Min) between the maximum value (Max) of the film thickness and the minimum value (Min) of the film thickness is 0.18 nm, and the value of the film thickness distribution obtained from (Max−Min)/AVG is 1.052%, as illustrated in FIG. 16.

In addition, the silicon oxide film deposited on the wafer W for 21 minutes in the case where the turntable 2 is caused to undergo the counterclockwise orbital rotation while the wafer W rotates, has the average film thickness (AVG) of 10.97 nm, the maximum value (Max) of the film thickness of 11.08 nm, and the minimum value (Min) of the film thickness of 10.84 nm, as illustrated in FIG. 16. From these results, the difference (Max−Min) between the maximum value (Max) of the film thickness and the minimum value (Min) of the film thickness is 0.24 nm, and the value of the film thickness distribution obtained from (Max−Min)/AVG is 1.093%, as illustrated in FIG. 16.

On the wafer W, the value of the film thickness distribution is preferably within a range of ±0.75%, and more preferably within a range of ±0.7%. From FIG. 15, the film thickness deposited by the clockwise orbital rotation of the turntable 2, which makes the value of the film thickness distribution fall within the range of ±0.7%, is 7.3 nm or greater and 11 nm or less, and thus, the proportion of the film deposition time by the clockwise orbital rotation of the turntable 2 is 34% or higher and 53% or lower. In addition, the value of the film thickness distribution is more preferably within a range of ±0.68%, and the film thickness deposited by the clockwise orbital rotation of the turntable 2, which makes the value of the film thickness distribution fall within this range, is 7.6 nm or greater and 10.2 nm or less, and the proportion of the film deposition time by the clockwise orbital rotation of the turntable 2 is 36% or higher and 49% or lower. Further, the value of the film thickness distribution is furthermore preferably within a range of ±0.66%, and the film thickness deposited by the clockwise orbital rotation of the turntable 2, which makes the value of the film thickness distribution fall within this range, is 8.0 nm or greater and 9.5 nm or less, and thus, the proportion of the film deposition time by the clockwise orbital rotation of the turntable 2 is 37% or higher and 45% or lower.

[Modification]

Next, the substrate processing method according to a modification of this embodiment will be described. In this modification, the film deposition in which the turntable 2 is caused to undergo the clockwise orbital rotation and the counterclockwise orbital rotation, while the wafer rotates, is repeated a plurality of times. This film deposition may be repeated n times, where n is an natural number greater than or equal to 2.

Figure 17:
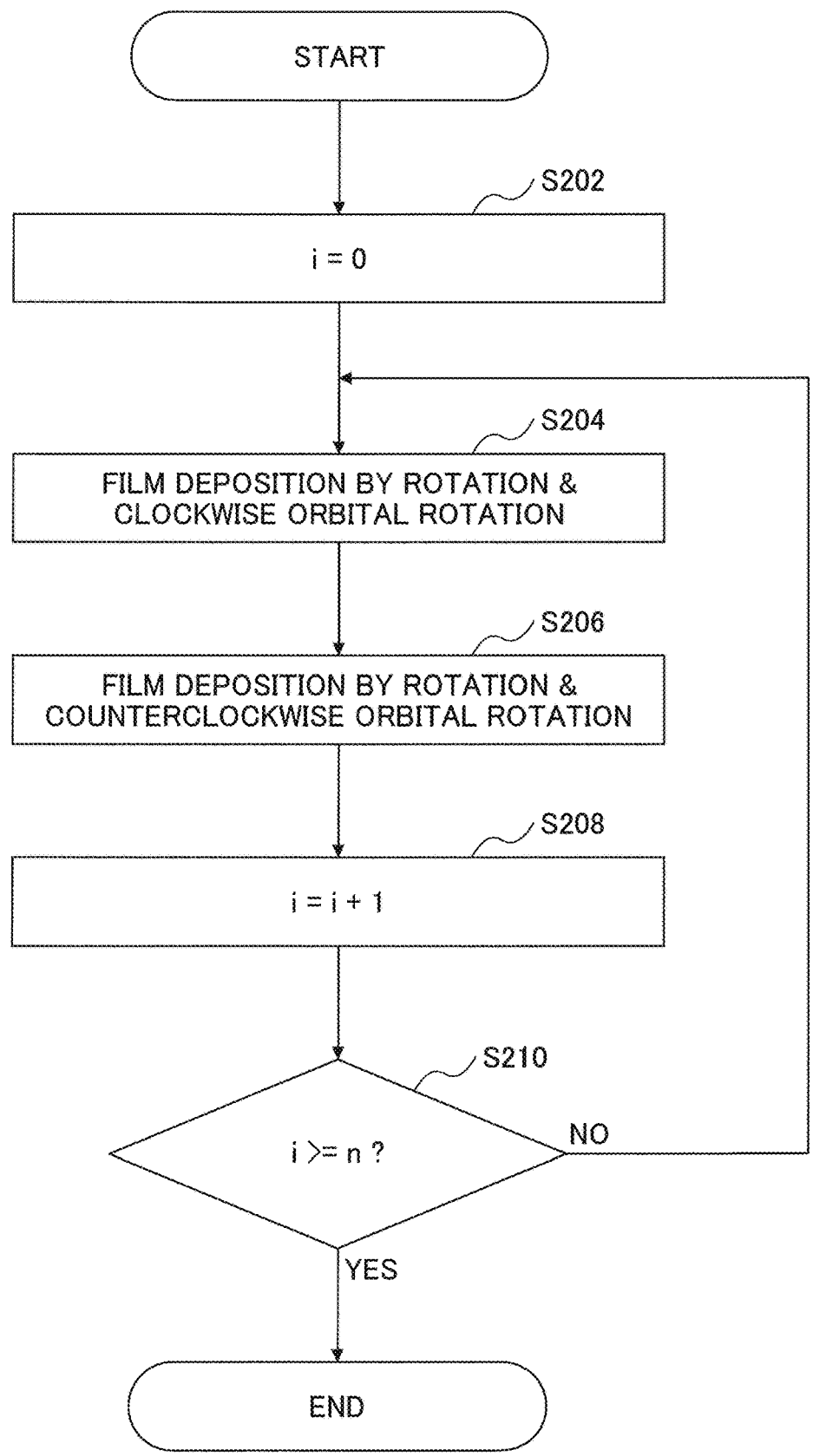
FIG. 17 is a flow chart illustrating the substrate processing method according to a modification of the embodiment.

The substrate processing method according to this modification will be described, by referring to FIG. 17.

First, when the process starts, an integer i is initialized to i=0 in step S202.

Next, a film deposition process is performed in step S204 by causing the wafer holder 24 to rotate, and causing the turntable 2 to undergo clockwise orbital rotation in a state where the wafer W rotates. Hence, in the substrate processing apparatus illustrated in FIG. 2, the wafer W moves past the adsorption region R1, the oxidation region R2, and the plasma processing region R3 in this order.

Next, the film deposition process is performed in step S206 by causing the wafer holder 24 to rotate, and causing the turntable 2 to undergo counterclockwise orbital rotation in the state where the wafer W rotates. Thus, in the substrate processing apparatus illustrated in FIG. 2, the wafer W moves past the oxidation region R2, the adsorption region R1, and the plasma processing region R3 in this order.

Next, the integer i is updated in step S208 by incrementing this integer i to i=i+1.

Next, a decision is made in step S210 to determine whether the integer i is greater than or equal to n. When the decision result in step S210 is NO, the process returns to step S204, and the film deposition in steps S204 employing the clockwise orbital rotation of the turntable 2, and the film deposition in step S206 employing the counterclockwise orbital rotation of the turntable 2, are repeated until the decision result in step S210 becomes YES. When the film deposition in step S204 and the film deposition in step S206 are repeated n times and the decision result in step S210 becomes YES, the process ends.

According to each of the embodiments and modifications, it is possible to further improve the uniformity of the thickness distribution of the film that is deposited by the substrate processing apparatus in which the substrate is caused to rotate and undergo orbital rotation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method implemented in a substrate processing apparatus that includes a processing chamber, a turntable on which a substrate is placed inside the processing chamber, and a first gas supply and a second gas supply configured to supply a first gas and a second gas, respectively, the substrate processing method comprising:
    depositing a film, generated by a reaction between the first gas and the second gas, on the substrate in a first state where the substrate rotates independently of the turntable and the turntable undergoes a clockwise orbital rotation around a rotating shaft so that the substrate passes through a region supplied with the first gas and thereafter passes through a region supplied with the second gas; and
    depositing the film on the substrate in a second state where the substrate rotates independently of the turntable and the turntable undergoes a counterclockwise orbital rotation,
    wherein a first deposition time in the first state is shorter than a second deposition time in the second state.

2. The substrate processing method as claimed in claim 1, wherein
    the first gas is a source gas that is adsorbed on a surface of the substrate, and
    the second gas is an oxidation gas that reacts with the source gas adsorped on the substrate, and generates a reaction product that is deposited on the substrate as the film.

3. The substrate processing method as claimed in claim 2, further comprising:
    supplying the first gas from the first gas supply, and supplying the second gas from the second gas supply, respectively disposed along a peripheral direction of the turntable, to form, inside the processing chamber, an adsorption region supplied with the first gas and an oxidation region supplied with the second gas; and
    supplying a nitrogen gas for separating the adsorption region and the oxidation region, from a separation gas supply disposed between the adsorption region and the oxidation region along the peripheral direction of the turntable.

4. The substrate processing method as claimed in claim 3, further comprising:
    generating plasma in a plasma processing region by a plasma forming part, between the adsorption region and the oxidation region along the peripheral direction of the turntable.

5. The substrate processing method as claimed in claim 4, wherein the adsorption region, the oxidation region, and the plasma processing region are disposed along the peripheral direction of the turntable, clockwise around a center formed by the rotating shaft of the turntable.

6. The substrate processing method as claimed in claim 1, further comprising:
    rotating a plurality of substrates on the turntable while causing the turntable to undergo an orbital rotation around the rotating shaft.

7. The substrate processing method as claimed in claim 1, wherein the depositing the film on the substrate in the first state, and the depositing the film on the substrate in the second state, are repeated a plurality of times.

8. The substrate processing method as claimed in claim 2, wherein the depositing the film on the substrate in the first state, and the depositing the film on the substrate in the second state, are repeated a plurality of times.

9. The substrate processing method as claimed in claim 3, wherein the depositing the film on the substrate in the first state, and the depositing the film on the substrate in the second state, are repeated a plurality of times.

10. The substrate processing method as claimed in claim 4, wherein the depositing the film on the substrate in the first state, and the depositing the film on the substrate in the second state, are repeated a plurality of times.

11. The substrate processing method as claimed in claim 5, wherein the depositing the film on the substrate in the first state, and the depositing the film on the substrate in the second state, are repeated a plurality of times.

12. The substrate processing method as claimed in claim 6, wherein the depositing the film on the substrate in the first state, and the depositing the film on the substrate in the second state, are repeated a plurality of times.

13. The substrate processing method as claimed in claim 1, wherein
    a first proportion of the first film deposition time with respect to a total film deposition time, which is a sum of the first film deposition time and the second film deposition time, is 37% or higher and 45% or lower, and
    a second proportion of the second film deposition time with respect to the total film deposition time is greater than the first proportion.

14. The substrate processing method as claimed in claim 1, wherein the first film deposition time and the second film deposition time are set so that a value of a film thickness distribution (Max−Min)/AVG falls within a range of ±0.75%, where Max denotes a maximum value of a thickness of the film, Min denotes a minimum value of the thickness of the film, and AVG denotes an average value of the thickness of the film.

15. A non-transitory computer-readable storage medium having stored therein a program which, when executed by a computer of a substrate processing apparatus including a processing chamber, a turntable on which a substrate is placed inside the processing chamber, and a first gas supply and a second gas supply configured to supply a first gas and a second gas, respectively, causes the computer to perform a process comprising:

controlling a first driver of the substrate processing apparatus, configured to drive a holder that holds the substrate on the turntable, to rotate the substrate, and controlling a second driver of the substrate processing apparatus, configured to drive a rotating shaft, to cause a clockwise orbital rotation of the turntable around the shaft, so as to deposit a film, generated by a reaction between the first gas and the second gas, on the substrate in a first state where the substrate rotates independently of the turntable and the turntable undergoes the clockwise orbital rotation so that the substrate passes through a region supplied with the first gas and thereafter passes through a region supplied with the second gas; and controlling the first driver to rotate the substrate, and controlling the second driver to cause a counterclockwise orbital rotation of the turntable, so as to deposit a film, generated by a reaction between the first gas and the second gas, on the substrate in a second state where the substrate rotates independently of the turntable and the turntable undergoes the counterclockwise orbital rotation, wherein a first deposition time in the first state is shorter than a second deposition time in the second state.

16. The non-transitory computer-readable storage medium as claimed in claim 15, wherein the process further comprises:

controlling the first and second gas supplies to form an adsorption region and an oxidation region inside the processing chamber; and controlling a separation gas supply of the substrate processing apparatus to separate the adsorption region and the oxidation region by the supplying a nitrogen gas.

17. The non-transitory computer-readable storage medium as claimed in claim 16, wherein the process further comprises:

controlling a plasma forming part of the substrate processing apparatus to generate plasma in a plasma processing region, between the adsorption region and the oxidation region along the peripheral direction of the turntable.

18. The non-transitory computer-readable storage medium as claimed in claim 17, wherein the controlling the first and second gas supplies, the controlling the separation gas supply, and the controlling the plasma forming part respectively form the adsorption region, the oxidation region, and the plasma processing region along the peripheral direction of the turntable, clockwise around a center formed by the rotating shaft of the turntable.

19. The non-transitory computer-readable storage medium as claimed in claim 15, wherein the controlling the first and second drivers in the first state, and the controlling the first and second drivers in the second state, respectively drive a plurality of holders each configured to hold a corresponding one of a plurality of substrates on the turntable, to rotate the plurality of substrates on the turntable while causing the turntable to undergo an orbital rotation around the rotating shaft.

20. The non-transitory computer-readable storage medium as claimed in claim 15, wherein the process further comprises:

repeating the controlling the first and second drivers in the first state, and the controlling the first and second drivers in the second state, a plurality of times.

* * * * *